(12) United States Patent
Godo et al.

(10) Patent No.: US 9,859,238 B2
(45) Date of Patent: Jan. 2, 2018

(54) SEMICONDUCTOR DEVICE COMPRISING REGIONS OF DIFFERENT CURRENT DRIVE CAPABILITIES

(71) Applicant: Mitsubishi Electric Corporation, Tokyo (JP)

(72) Inventors: Shinsuke Godo, Tokyo (JP); Atsunobu Kawamoto, Tokyo (JP); Koji Yamamoto, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/121,499

(22) PCT Filed: Jun. 26, 2014

(86) PCT No.: PCT/JP2014/066941
§ 371 (c)(1),
(2) Date: Aug. 25, 2016

(87) PCT Pub. No.: WO2015/198435
PCT Pub. Date: Dec. 30, 2015

(65) Prior Publication Data
US 2016/0358869 A1 Dec. 8, 2016

(51) Int. Cl.
*H01L 29/15* (2006.01)
*H01L 23/00* (2006.01)
(Continued)

(52) U.S. Cl.
CPC ............ *H01L 24/05* (2013.01); *F02P 3/0552* (2013.01); *H01L 23/4824* (2013.01);
(Continued)

(58) Field of Classification Search
USPC ......................................................... 257/77
See application file for complete search history.

(56) References Cited

U.S. PATENT DOCUMENTS

| 2005/0167742 A1 | 8/2005 | Challa et al. |
| 2013/0026494 A1* | 1/2013 | Oritsuki ............... H01L 29/456 257/77 |
| 2015/0207407 A1* | 7/2015 | Nishiwaki ............ H01L 23/34 323/271 |

FOREIGN PATENT DOCUMENTS

| JP | 59-087828 A | 5/1984 |
| JP | 05-160409 A | 6/1993 |

(Continued)

OTHER PUBLICATIONS

Notification of Transmittal of Translation of the International Preliminary Report on Patentability and Translation of Written Opinion of the International Searching Authority; PCT/JP2014/066941 dated Jan. 5, 2017.

(Continued)

*Primary Examiner* — Jami M Valentine
(74) *Attorney, Agent, or Firm* — Studebaker & Brackett PC (57) ABSTRACT

An object of the present invention is to provide a semiconductor device capable of eliminating unevenness of current distribution in a plane. A semiconductor device according to the present invention is a semiconductor device including a transistor cell region where a plurality of transistor cells is arranged on a semiconductor substrate, the semiconductor device including an electrode pad which is arranged avoiding the transistor cell region on the semiconductor substrate and is electrically connected to a one-side current electrode of each of the cells, in which the transistor cell region contains a plurality of regions each of which has a different current drive capability from each other depending on a distance from the electrode pad.

15 Claims, 12 Drawing Sheets

(51) Int. Cl.
- *H01L 29/739* (2006.01)
- *H01L 29/78* (2006.01)
- *H01L 27/04* (2006.01)
- *H01L 29/06* (2006.01)
- *H01L 29/12* (2006.01)
- *F02P 3/055* (2006.01)
- *H01L 27/06* (2006.01)
- *H01L 29/16* (2006.01)
- *H01L 23/482* (2006.01)
- *H01L 29/40* (2006.01)
- *H01L 29/08* (2006.01)
- *H01L 29/10* (2006.01)

(52) U.S. Cl.
CPC .......... *H01L 27/04* (2013.01); *H01L 27/0664* (2013.01); *H01L 29/06* (2013.01); *H01L 29/0696* (2013.01); *H01L 29/08* (2013.01); *H01L 29/10* (2013.01); *H01L 29/12* (2013.01); *H01L 29/1608* (2013.01); *H01L 29/40* (2013.01); *H01L 29/739* (2013.01); *H01L 29/7397* (2013.01); *H01L 29/78* (2013.01); *H01L 24/45* (2013.01); *H01L 24/48* (2013.01); *H01L 24/85* (2013.01); *H01L 2224/04042* (2013.01); *H01L 2224/0502* (2013.01); *H01L 2224/05013* (2013.01); *H01L 2224/05015* (2013.01); *H01L 2224/0556* (2013.01); *H01L 2224/05552* (2013.01); *H01L 2224/05553* (2013.01); *H01L 2224/05554* (2013.01); *H01L 2224/05555* (2013.01); *H01L 2224/45124* (2013.01); *H01L 2224/4847* (2013.01); *H01L 2224/85205* (2013.01); *H01L 2924/10253* (2013.01); *H01L 2924/10272* (2013.01); *H01L 2924/13055* (2013.01); *H01L 2924/13091* (2013.01); *H01L 2924/351* (2013.01)

(56) References Cited

FOREIGN PATENT DOCUMENTS

| | | |
|---|---|---|
| JP | 10-112541 A | 4/1998 |
| JP | 2000-058820 A | 2/2000 |
| JP | 2007-529115 A | 10/2007 |
| WO | 2005/065385 A2 | 7/2005 |

OTHER PUBLICATIONS

International Search Report issued in PCT/JP2014/066941; dated Sep. 22, 2014.

JP Office Action dated May 23, 2017, from corresponding JP Appl No. 2016-528930, with English translation, 7 pp.

* cited by examiner

SEMICONDUCTOR DEVICE COMPRISING REGIONS OF DIFFERENT CURRENT DRIVE CAPABILITIES

TECHNICAL FIELD

The present invention relates to a semiconductor device suitable for driving an inductive load in, for example, an ignition system of an internal-combustion engine.

BACKGROUND ART

Conventionally, in a layout of a semiconductor device (semiconductor chip) which is provided with a switching element such as an Insulated Gate Bipolar Transistor (IGBT) and is used in an igniter, the same structure is adopted in a plane of the semiconductor device, however a current density upon the electric power supply to the semiconductor device is not even in the plane, and unevenness occurs locally. Accordingly, breakdown resistance of the semiconductor device is limited by a portion where the current density becomes high locally, and portions other than the portion where the current density becomes high locally have a margin for the current density (for example, refer to Patent Documents 1, 2).

PRIOR ART DOCUMENTS

Patent Documents

Patent Document 1: Japanese Patent Application Laid-Open No. 59-87828 (1984)
Patent Document 2: Japanese Patent Application Laid-Open No. 05-160409 (1993)

SUMMARY OF INVENTION

Problem to be Solved by the Invention

In the above described semiconductor device, a conductive wire (generally, aluminum) is electrically connected to an emitter pad (a reference potential region) by ultrasonic bonding technology. A layout in which a DMOS structure such as an IGBT cell (hereinafter, merely referred to as the IGBT cell) is not disposed in a region where the emitter pad is formed is often adopted, such that a structure of a switching element is not damaged by stress in the bonding.

Since a chip area of the semiconductor device is finite, and a distance from the emitter pad to each region where the IGBT cell is formed (hereinafter, referred to as an IGBT cell region) is different from each other, current load tends to become larger in a portion near the emitter pad than in a portion apart from the emitter pad. On the other hand, in the IGBT cell region near the emitter pad where the IGBT cell is not disposed, it is found through an experiment that the current density is low, due to transient variation in carrier concentration in the semiconductor device, which contributes to conductivity at a fast shutoff. As a result, a region where the current density is maximized exists between a region apart from the emitter pad and a region near the emitter pad, and the relevant region serves as a starting point of an electrification breakdown.

In this manner, since there is a difference in the current density depending on the region in a plane of the semiconductor device, a trade-off relation between a current drive capability and breakdown resistance of the switching element occurs, and then there is a problem in which the size and cost of the semiconductor device is restricted.

The present invention is made to solve such a problem, and it is an object thereof to provide a semiconductor device capable of eliminating unevenness of current distribution in the plane.

Means for Solving the Problem

In order to solve the above problem, a semiconductor device according to the present invention is a semiconductor device including a transistor cell region where a plurality of transistor cells is arranged on a semiconductor substrate, includes an electrode pad which is arranged avoiding the transistor cell region on the semiconductor substrate and is electrically connected to a one-side current electrode of each of the cells, and is characterized in that the transistor cell region contains a plurality of regions each of which has a different current drive capability from each other depending on a distance from the electrode pad.

Effects of the Invention

According to the present invention, a semiconductor device is a semiconductor device including a transistor cell region where a plurality of transistor cells is arranged on a semiconductor substrate, including an electrode pad which is arranged avoiding the transistor cell region on the semiconductor substrate and is electrically connected to a one-side current electrode of each of the cells, in which the transistor cell region contains a plurality of regions each of which has a different current drive capability from each other depending on a distance from the electrode pad, whereby it becomes possible to eliminate unevenness of current distribution in the plane.

Objects, features, aspects, and advantages of the present invention will become more apparent from the following detailed description and attached drawings.

DESCRIPTION OF EMBODIMENTS

Embodiments of the present invention will be described below with reference to the drawings.

<Underlying Technology>

First, an ignition system of an internal-combustion engine will be described.

Figure 16:
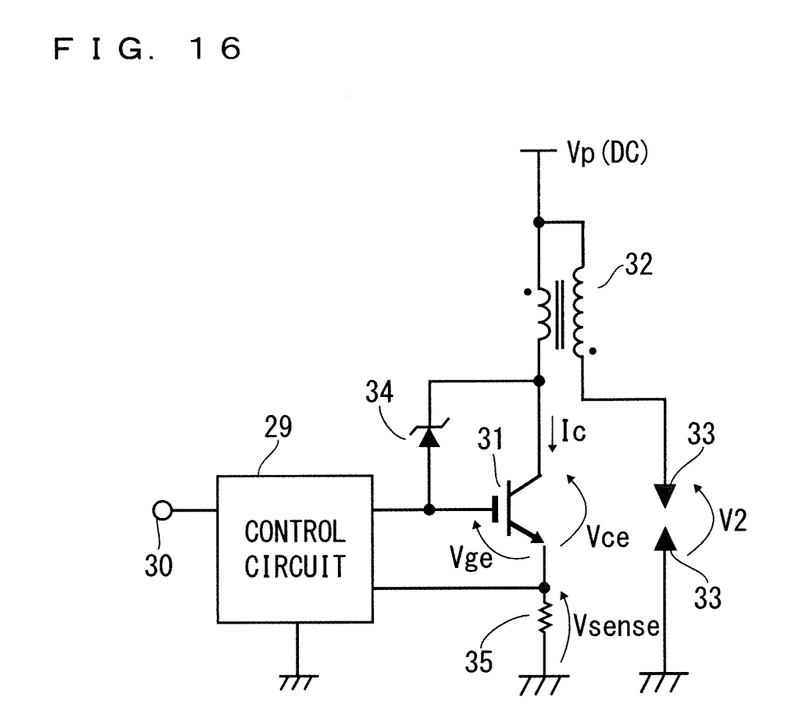
FIG. 16 is a diagram illustrating an example of a circuit configuration of an ignition system of an internal-combustion engine.

FIG. 16 is a diagram illustrating an example of a circuit configuration of the ignition system of the internal-combustion engine. Further, FIG. 17 is a diagram illustrating an example of an operation in the circuit of FIG. 16.

A control circuit 29 receives an on signal from a control computer via a control terminal 30, and drives a transistor 31 (switching element) by using a drive signal based on the received on signal. Specifically, the control circuit 29 causes a transformer 32 (inductive load) to store energy by supplying current to the transformer 32. Here, the transistor 31 is, for example, an IGBT.

Figure 17:
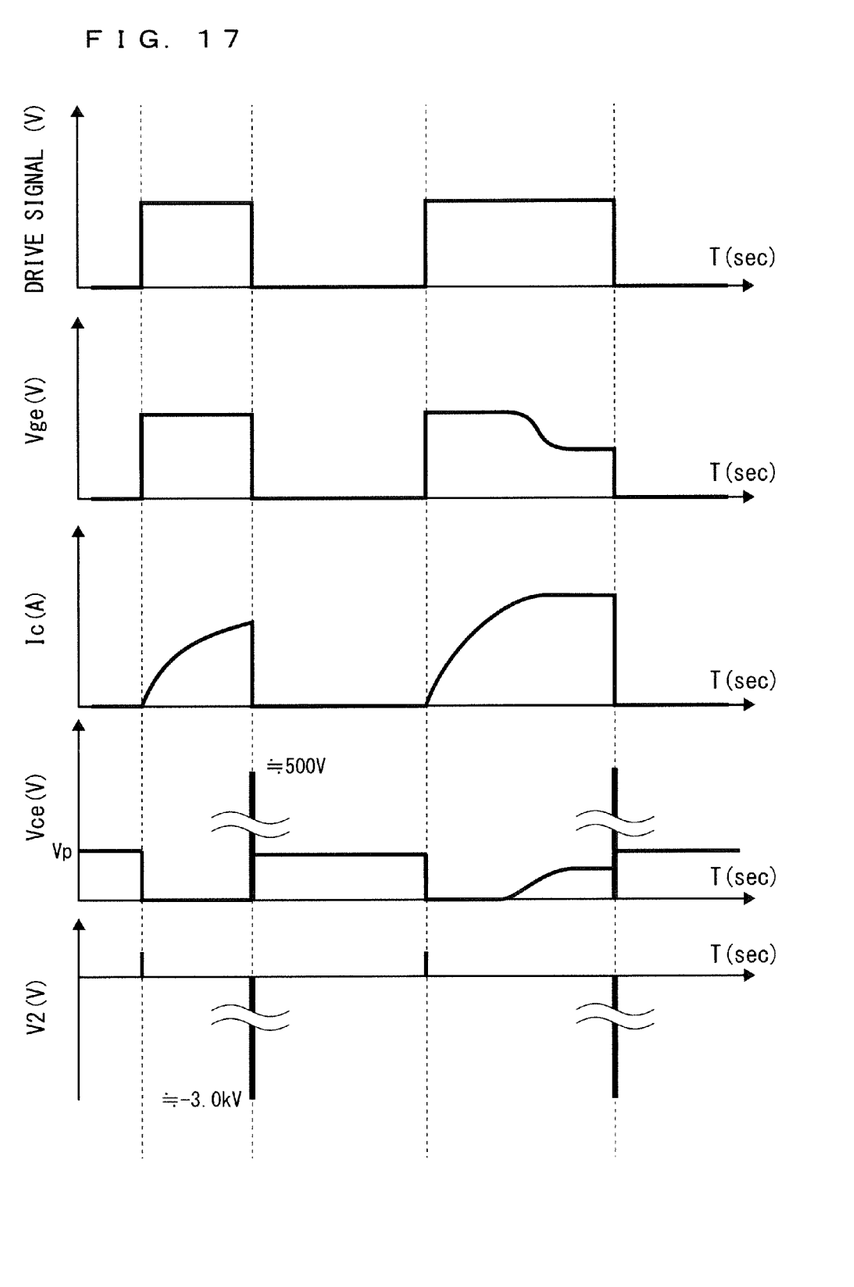
FIG. 17 is a diagram illustrating an example of an operation in a circuit of FIG. 16.

At an ignition timing (when a drive signal V in FIG. 17 is off), the control circuit 29 receives an off signal from the control computer via the control terminal 30, and turns off the transistor 31 by using a drive signal based on the received off signal. When the transistor 31 is shut off by being turned off, a voltage Vice is raised, and a high voltage which is multiplied by a winding number ratio is excited at a secondary side of the transformer 32 (generally, V2 is about −30 kV).

In general, in order to prevent a dielectric breakdown of winding wires of the transformer 32, a clamping diode 34 (Zener diode) is disposed between a collector and a gate of the transistor 31 such that Vice is clamped to about 500 V. In this manner, turning on the transistor 31 by raising the drive signal of the transistor 31 using the clamping diode 34 based on the raise in the corrector voltage is called as "active clamping", and a voltage in which an excessive voltage is not generated at the load (herein, the transformer 32) is set (in the example in FIG. 17, about 500 V).

A value of a load current Ic varies depending on an on time of the drive signal or a power supply voltage Vp, but is controlled so as not to be a predetermined value or more, in order to avoid a risk such as melting of the winding wires of the transformer 32 or magnetic saturation of a core of the transformer 32 (normally, a magnetic material such as iron). A maximum allowable current value at this time is defined as a "current limit value".

The transistor 31 which controls a primary-side current of the transformer 32 used in the ignition system for the internal-combustion engine such as an automobile engine performs a shut-off operation at the ignition timing, and generates an arc discharge at an ignition plug 33 by generating the high voltage at the secondary side of the transformer 32. Fuel is ignited by the arc discharge generated. Upon such an ignition, the transistor 31 performs the active clamping operation in order to avoid the dielectric breakdown of the winding wires of the transformer 32. The active clamping operation gives local heat generation to the transistor 31, and energy causing a breakdown of a part which generates heat most intensely is prescribed as a rating of the transistor 31.

Next, a semiconductor device according to the underlying technology including the transistor 31 will be described.

Figure 18:
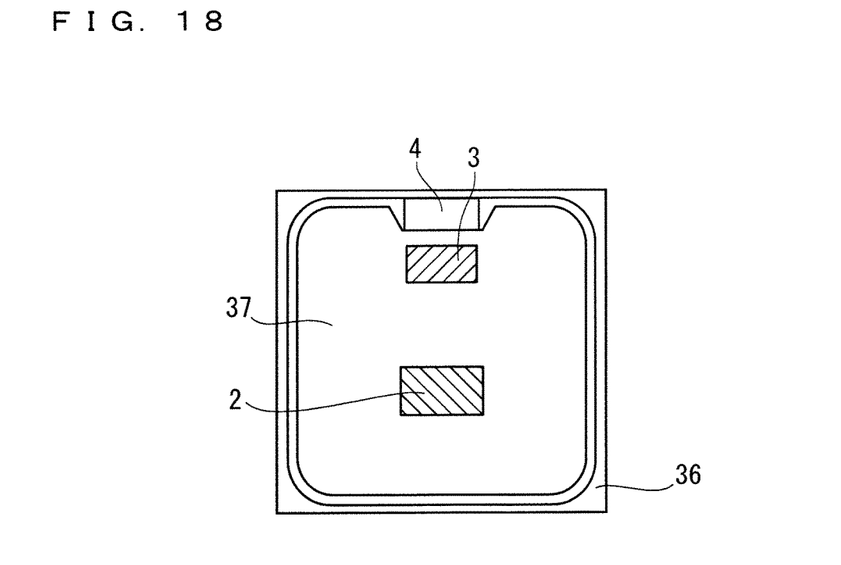
FIG. 18 is a view illustrating an example of a configuration of a semiconductor device according to an underlying technology.
Figure 19:
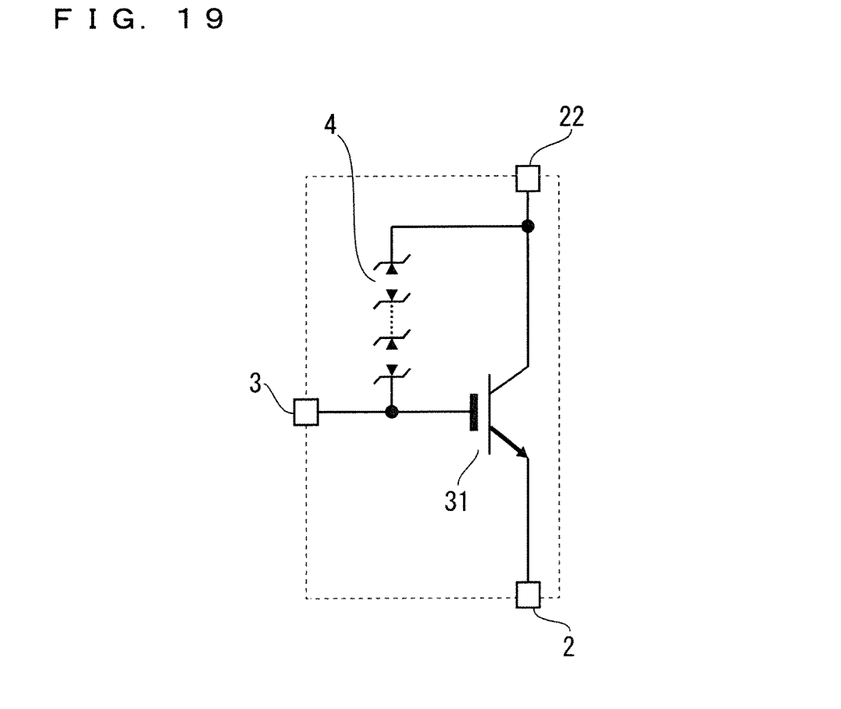
FIG. 19 is a diagram illustrating an equivalent circuit of FIG. 18.

FIG. 18 is a view illustrating an example of a configuration of a semiconductor device 36 according to the underlying technology, and is an external view of the semiconductor device 36 viewed from above. Further, FIG. 19 is a diagram illustrating an equivalent circuit of FIG. 18.

The semiconductor device 36 includes an emitter pad 2 (a reference potential region), a gate pad 3 (a region for a drive signal), a clamping diode 4, a collector electrode 22, and a transistor 31.

A transistor cell region 37 is formed with a plurality of transistors 31. The collector electrode 22 is formed on a back surface side (a back surface side of the paper surface of FIG. 18) of the semiconductor device 36, and is connected to a collector of each transistor 31. The gate pad 3 is connected to a gate of each transistor 31. The clamping diode 4 is connected between the gate and the collector of each transistor 31.

A conductive wire is electrically connected to the emitter pad 2. Further, none of the transistors 31 is formed in a region where the emitter pad 2 is formed.

In the semiconductor device 36 according to the underlying technology as illustrated in FIG. 18, as described above, since there is a difference in current density depending on a region in a plane of the semiconductor device 36, a trade-off relation between a current drive capability and breakdown resistance of the transistor 31 occurs in each region, and then there is a problem in which the size and cost of the semiconductor device 36 is restricted.

The present invention is made to solve such a problem, and will be described hereinafter in detail.

First Embodiment

Figure 1:
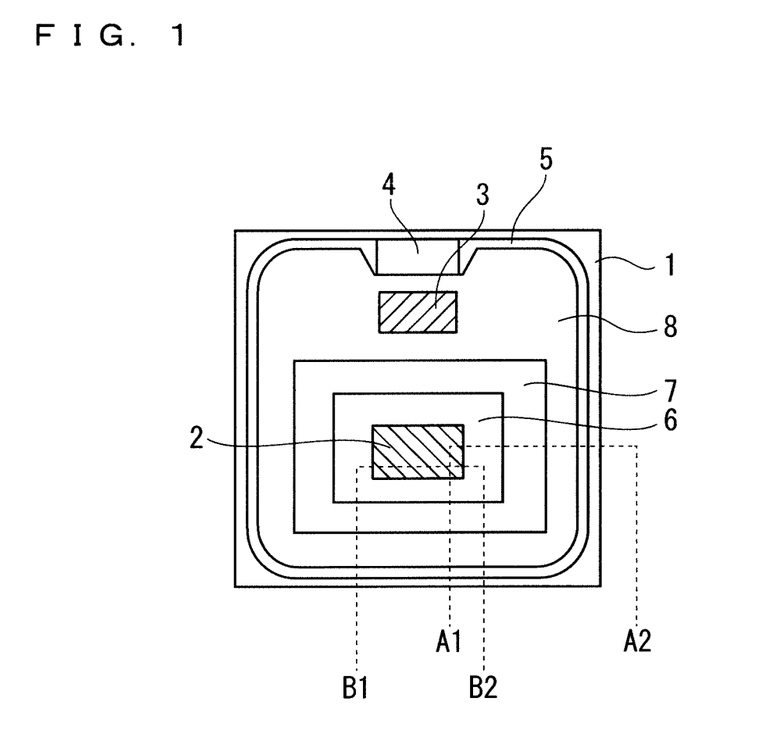
FIG. 1 is a view illustrating an example of a configuration of a semiconductor device according to a first embodiment of the present invention.
Figure 2:
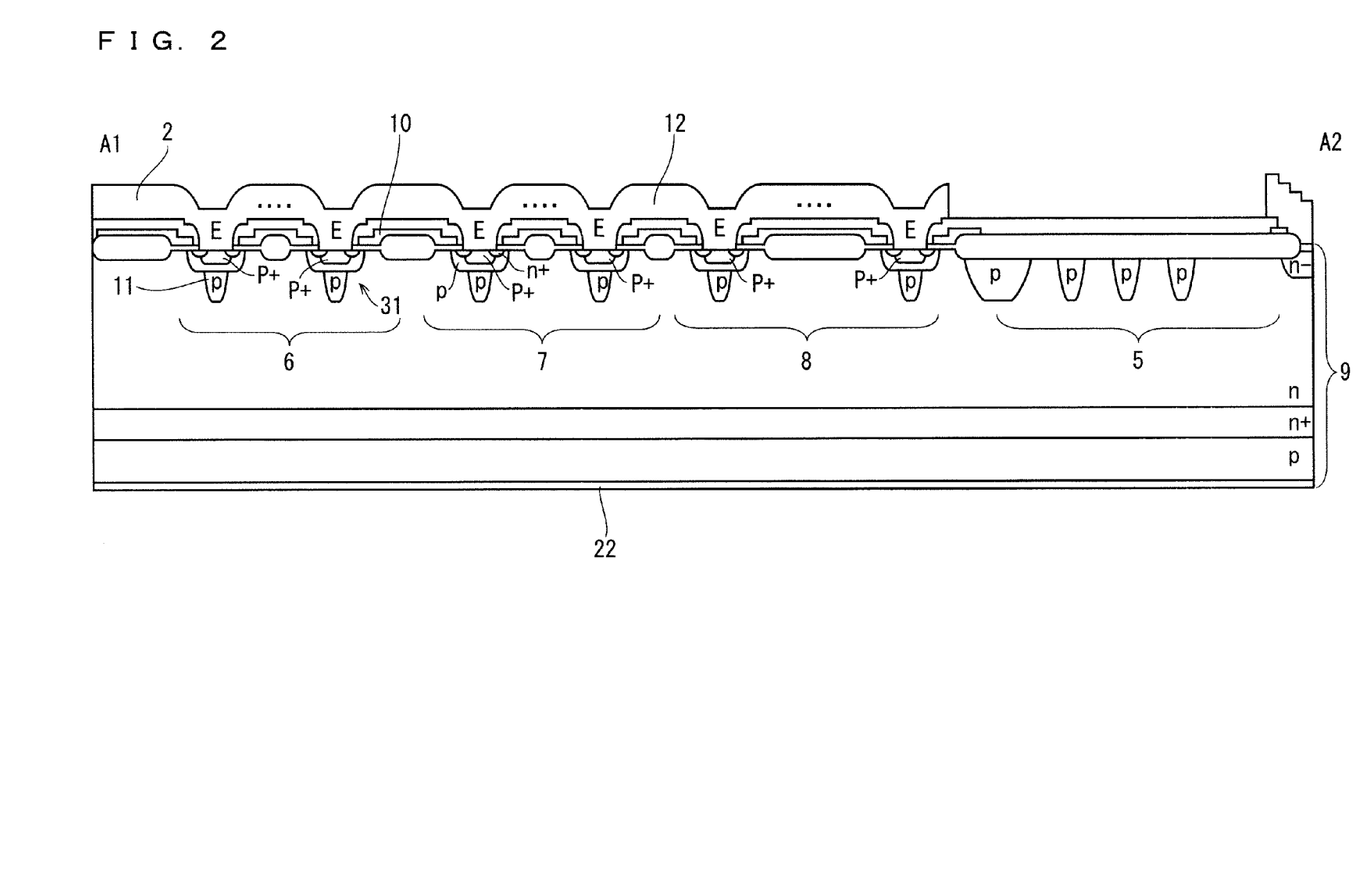
FIG. 2 is a sectional view taken along A1-A2 in FIG. 1.
Figure 3:
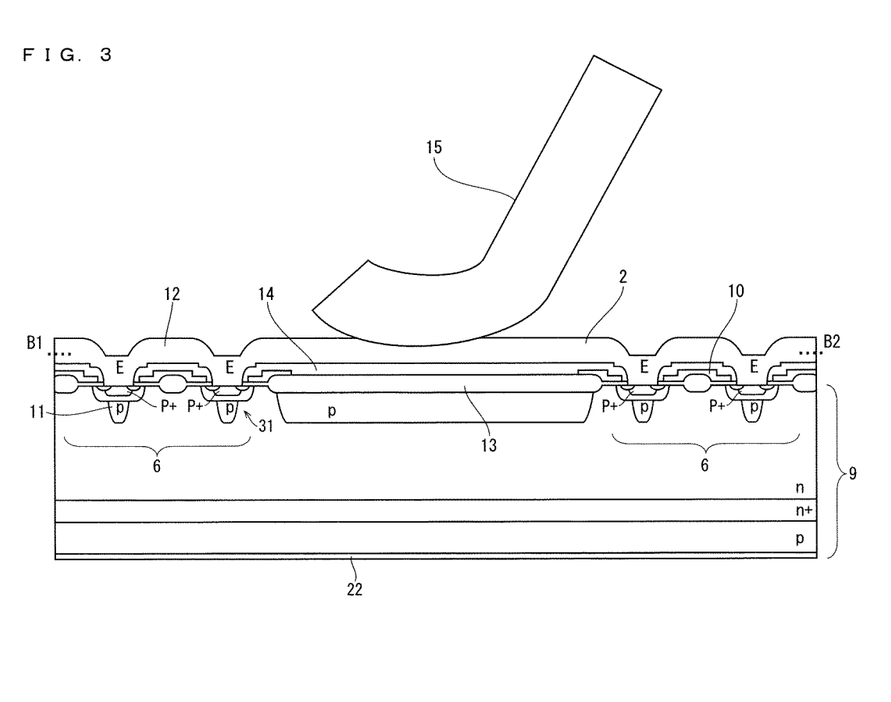
FIG. 3 is a sectional view taken along B1-B2 in FIG. 1.

FIG. 1 is a view illustrating an example of a configuration of a semiconductor device 1 according to a first embodiment of the present invention, and is an external view of the semiconductor device 1 viewed from above. FIG. 2 is a sectional view taken along A1-A2 in FIG. 1. FIG. 3 is a sectional view taken along B1-B2 in FIG. 1.

Here, an equivalent circuit of FIG. 1 is the same as that of FIG. 19. Further, though the IGBT is used as the transistor 31, a Metal Oxide Semiconductor Field Effect Transistor (MOSFET) may be used. Moreover, a semiconductor substrate 9 includes a silicon substrate.

The semiconductor device 1 includes an emitter pad 2 (a reference potential region, an electrode pad), a gate pad 3 (a region for a drive signal), a clamping diode 4, a collector electrode 22, and a transistor 31. Further, the semiconductor device 1 is used in the ignition system of the internal-combustion engine as illustrated in FIG. 16, and performs the operation as illustrated in FIG. 17.

A plurality of transistors 31 are formed in regions 6 to 8 (collectively corresponding to the transistor cell region 37 in FIG. 18) which will be described later. That is, in the regions 6 to 8, a plurality of cells of the transistors 31 are arranged.

The emitter pad 2 has a rectangular shape or a square shape, and is electrically connected with a conductive wire 15 (generally, aluminum) by ultrasonic bonding technology. In the example in FIG. 3, though an interlayer film 14 which is an oxide film is formed in a lower layer of a metal layer 12 configuring the emitter pad 2, the metal layer 12 may be directly connected to a semiconductor substrate 9 (specifically, a field oxide film 13 of the semiconductor substrate 9) in an ohmic manner by contact processing.

Furthermore, none of the transistors 31 is formed in a region where the emitter pad 2 is formed. That is, the emitter pad 2 is arranged avoiding the regions 6 to 8, and is electrically connected to an emitter electrode E (one-side current electrode) of each transistor 31 via the metal layer 12.

The collector electrode 22 is formed on a back surface side (a back surface side of the paper surface of FIG. 1) of the semiconductor device 1, and is connected to a collector of each transistor 31. The gate pad 3 is connected to a gate of each transistor 31. The clamping diode 4 is connected between the gate and the collector of each transistor 31.

In a region where the transistors 31 are formed (corresponding to the transistor cell region 37 in FIG. 18), a plurality of regions (a region 6, a region 7, and a region 8) is disposed, each of which has a different current drive capability from each other depending on a distance from the emitter pad 2. Here, in the present first embodiment, a case where three regions are disposed is described, but two or more regions may be applicable.

The region 6, the region 7, and the region 8 are adjusted such that a relationship of the current drive capability per unit area of the transistor 31 in each region is the region 7< the region 6≤ the region 8. The adjustment of the current drive capability is, in a case where the transistor 31 is the IGBT for example, performed by changing a pitch between gates, or a shape of an impurity implanting pattern of an impurity region 11 in an emitter contact part and near the emitter contact part.

In the above described semiconductor device 1, it has been found through an experiment that, in a transient state on the above described active clamping operation, a current tends to concentrate to the region 7, and the region 7 serves as a starting point of a breakdown in conditions of a circumferential environment, due to instantaneous heat generation. This fact means that, since current density in the plane of the semiconductor device 1 is uneven, breakdown resistance of the semiconductor device 1 is limited by breakdown resistance of the transistors 31 disposed in the region 7. However, in the semiconductor device 1, since a current share in the region where the current density is high (region 7) is distributed into surrounding regions (region 6, region 8), the semiconductor device 1 as a whole is made to have a more even current share, and thus higher breakdown resistance can be realized by using a semiconductor device of the same area.

As described above, according to the present first embodiment, it becomes possible to eliminate unevenness of current distribution in the plane. Furthermore, improvement of the trade-off relation between the current drive capability and the breakdown resistance of the transistor, which has been a problem conventionally, becomes possible, and thus it becomes possible to provide a semiconductor device at a lower cost.

Figure 4:
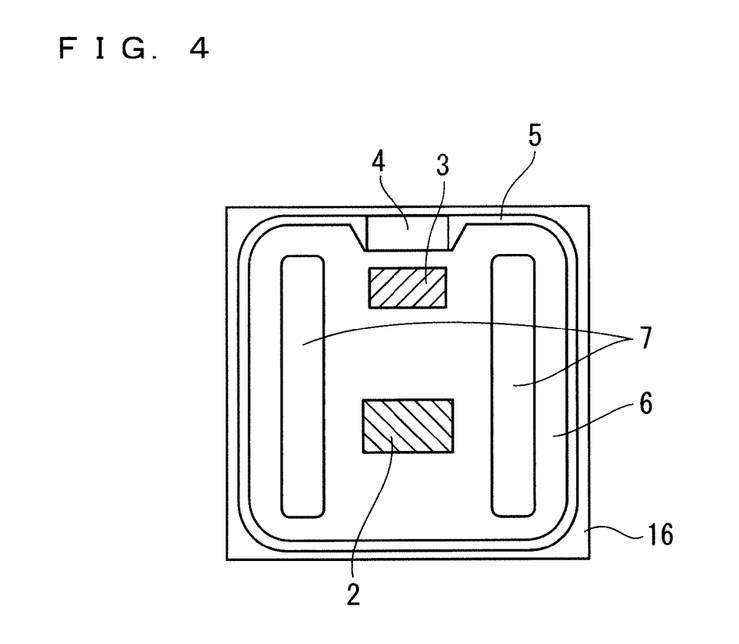
FIG. 4 is a view illustrating another example of the configuration of the semiconductor device according to the first embodiment of the present invention.
Figure 5:
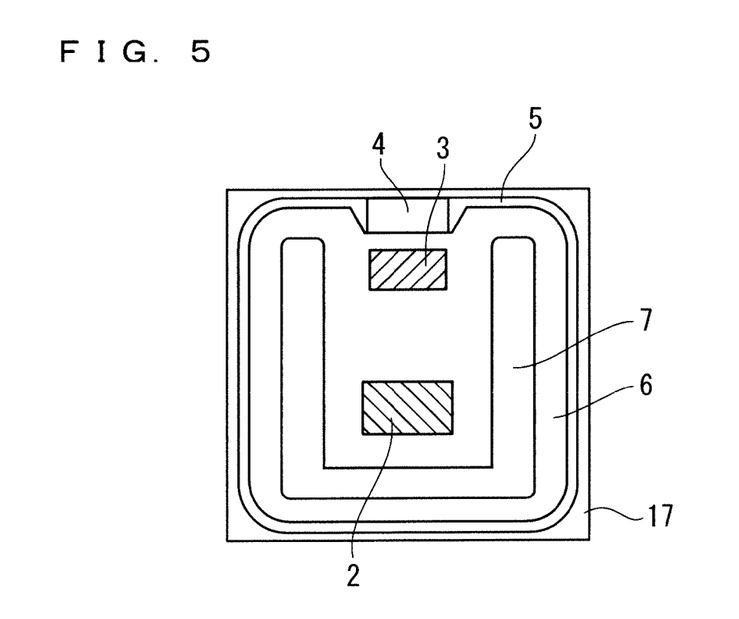
FIG. 5 is a view illustrating still another example of the configuration of the semiconductor device according to the first embodiment of the present invention.
Figure 6:
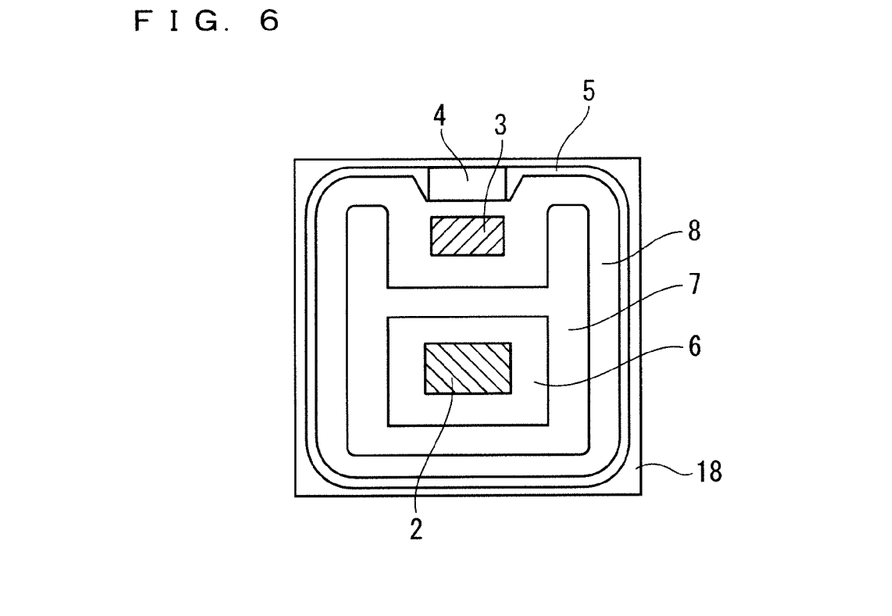
FIG. 6 is a view illustrating yet another example of the configuration of the semiconductor device according to the first embodiment of the present invention.

Here, in FIG. 1 described above, each of regions 6 to 8 is disposed so as to equally surround the emitter pad 2, however, depending on a layout pattern of the gate of the transistor 31 or an arrangement place of each pad, an effect similar to the above is obtained even by disposing each region as illustrated in FIGS. 4 to 6 (in FIGS. 4, 5, the regions 6, 7 only), so as to depend on the distance from the emitter pad 2.

Second Embodiment

Figure 7:
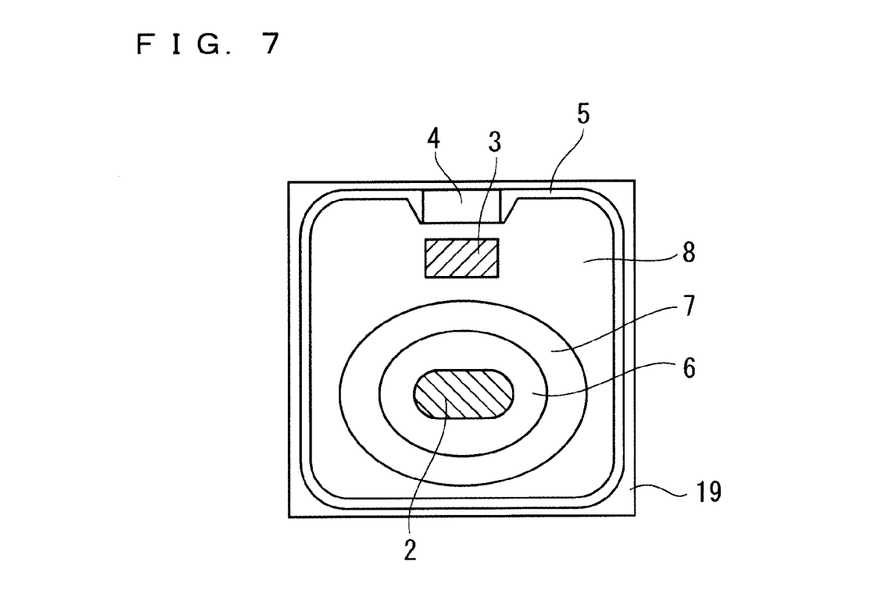
FIG. 7 is a view illustrating an example of a configuration of a semiconductor device according to a second embodiment of the present invention.

FIG. 7 is a view illustrating an example of a configuration of a semiconductor device 19 according to a second embodiment of the present invention, and is an external view of the semiconductor device 19 viewed from above.

The present second embodiment is characterized in that the emitter pad 2 has a circular shape, an elliptical shape, or a polygonal shape having at least five or more vertices. Since other configurations are the same as those in the first embodiment, the description will be omitted here.

As illustrated in FIG. 7, the emitter pad 2 is formed into the elliptical shape. Further, regions 6 to 8 are disposed so as to surround a periphery of the emitter pad 2.

The shape of the emitter pad 2 is not limited to a round shape such as the elliptical shape and the circular shape, and may be the polygonal shape having five or more vertices. As for a pattern mask for an exposure apparatus used upon forming a pattern of a semiconductor device using a photoengraving technique, a shape of the pattern is designed using a computer. A circular pattern is practically converted to a shape approximated to the polygon, and the pattern mask is made based on coordinate data of each vertex of the polygon. That is, if the number of vertices of the polygon is increased, the pattern mask is eventually made to have a shape which is approximately the elliptical shape or the circular shape.

As described above, according to the present second embodiment, since distances between a boundary of each of the regions 6 to 8 and the emitter pad 2 are more even than those of the first embodiment, unevenness of the current (heat generation) in each of the regions 6 to 8 is moderated, and then it becomes possible to further improve usage efficiency of the transistors 31.

Third Embodiment

Figure 8:
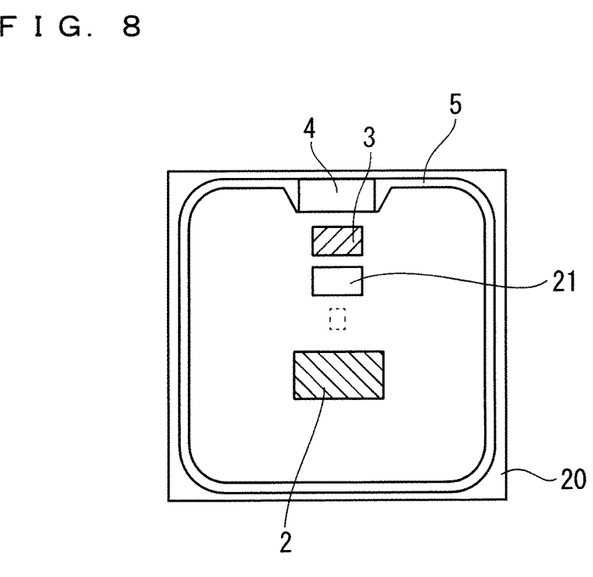
FIG. 8 is a view illustrating an example of a configuration of a semiconductor device according to a third embodiment of the present invention.

FIG. 8 is a view illustrating an example of a configuration of a semiconductor device 20 according to a third embodiment of the present invention, and is an external view of the semiconductor device 20 viewed from above. Further, FIG. 9 is a diagram illustrating an equivalent circuit of FIG. 8.

The present third embodiment is characterized in that the transistor 31 (the cell of the transistor) includes, in addition to the emitter electrode, a current detection electrode having a smaller area than that of the emitter electrode. Since other configurations are the same as those in the first embodiment, the description will be omitted here.

Figure 9:
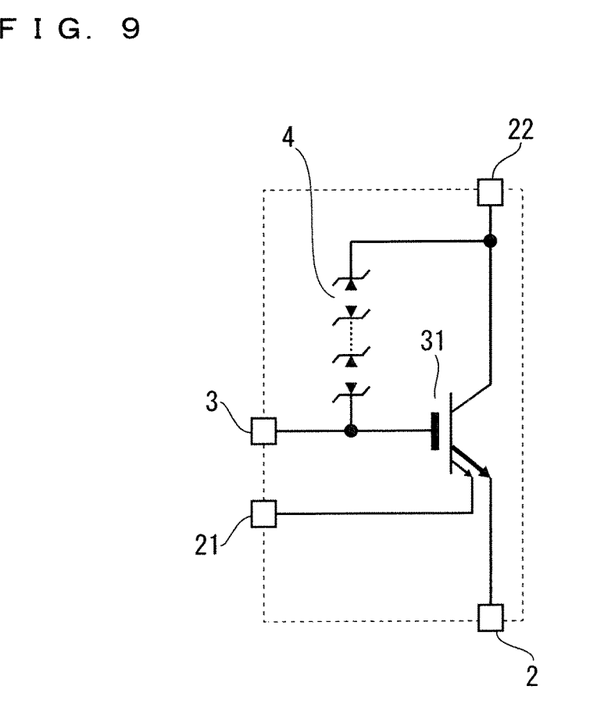
FIG. 9 is a diagram illustrating an equivalent circuit of FIG. 8.

As illustrated in FIGS. 8, 9, the current detection electrode of the transistor 31 is connected to a current detection emitter pad 21. That is, the semiconductor device 20 includes the transistor 31 configured by being connected to each of the emitter pad 2, the gate pad 3, and the collector electrode 22; and a current detection transistor configured by being connected to each of the current detection emitter pad 21, the gate electrode pad 3, and the collector electrode 22. Further, the current detection transistor is smaller in size than the transistor 31. The current detection transistor is formed in a region indicated by a broken line in FIG. 8.

As described above, according to the present third embodiment, since the semiconductor device 20 includes the current detection transistor which is smaller in size than the transistor 31, current detection using a smaller detection resistor becomes possible, and signal transmission to the control circuit becomes possible. Further, since a similar effect as in the past can be realized by using the smaller resistor than a conventional current detection resistor 35 as illustrated in FIG. 16, reduction in size and cost of the semiconductor device can be realized.

Here, in the above description, a case where the present third embodiment is applied to the first embodiment is described, but the present third embodiment can be also applied to the second embodiment. Furthermore, the current detection transistor may be disposed not only in the region indicated by the broken line in FIG. 8, but also in an arbitrary region.

Fourth Embodiment

Figure 10:
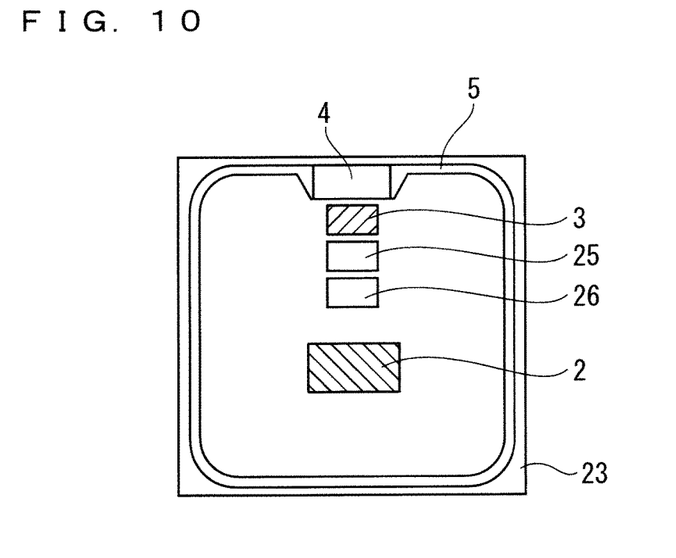
FIG. 10 is a view illustrating an example of a configuration of a semiconductor device according to a fourth embodiment of the present invention.

FIG. 10 is a view illustrating an example of a configuration of a semiconductor device 23 according to a fourth embodiment of the present invention, and is an external view of the semiconductor device 23 viewed from above. Further, FIG. 11 is a diagram illustrating an equivalent circuit of FIG. 10.

The present fourth embodiment is characterized by further including a temperature detection diode 24 which detects a temperature of the semiconductor device 23. Since other configurations are the same as those in the first embodiment, the description will be omitted here.

Figure 11:
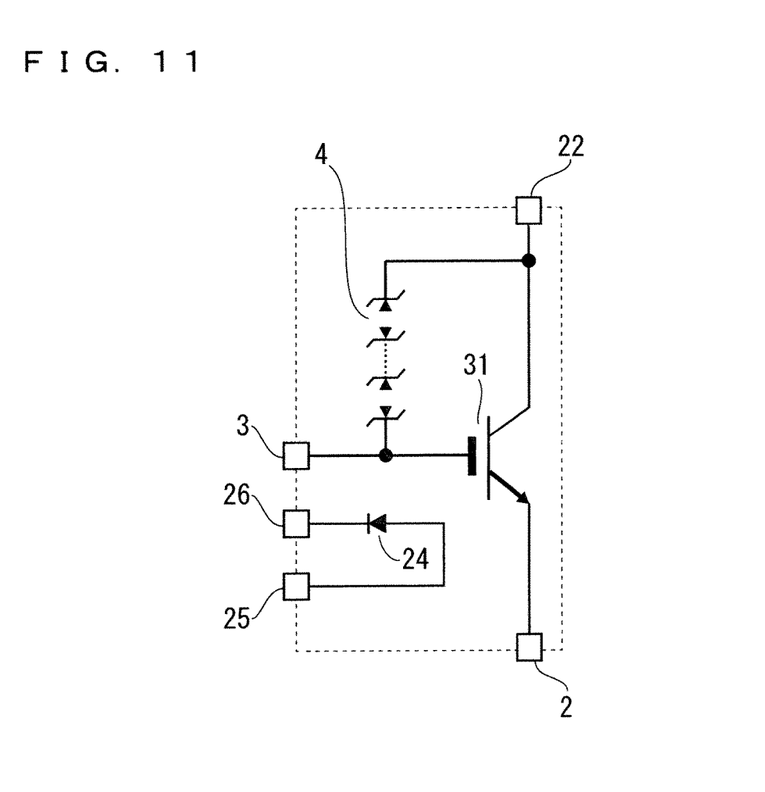
FIG. 11 is a diagram illustrating an equivalent circuit of FIG. 10.

As illustrated in FIGS. 10, 11, an anode of the temperature detection diode 24 is connected to an anode electrode 25, and a cathode of the temperature detection diode 24 is connected to a cathode electrode 26.

Here, the temperature detection diode 24 is generally formed of polysilicon, but may be formed of a material other than polysilicon. Further, the diode is used in a single stage in the example in FIG. 11, but a plurality of diodes may be used in multiple stages, which is connected in series.

As described above, according to the present fourth embodiment, since protection against an accident, which is performed based on a heat generation monitor or an overheat shut-off, is facilitated, by connecting the anode electrode 25 and the cathode electrode 26 to a temperature detection circuit (not illustrated) included in the control circuit 29, and enabling temperature detection of the semiconductor device 23, it is possible to avoid inconvenience caused by a transistor in an abnormal operation and to provide a semiconductor device with higher reliability.

Here, in the above description, a case where the present fourth embodiment is applied to the first embodiment is described, but the present fourth embodiment can be also applied to the second embodiment.

Fifth Embodiment

Figure 12:
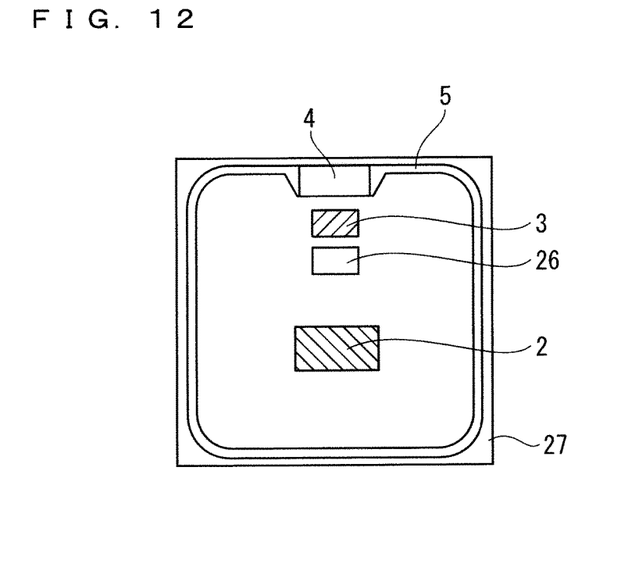
FIG. 12 is a view illustrating an example of a configuration of a semiconductor device according to a fifth embodiment of the present invention.

FIG. 12 is a view illustrating an example of a configuration of a semiconductor device 27 according to a fifth embodiment of the present invention, and is an external view of the semiconductor device 27 viewed from above. Further, FIG. 13 is a diagram illustrating an equivalent circuit of FIG. 12.

The present fifth embodiment is characterized in that the anode of the temperature detection diode 24 is connected to the emitter pad 2. Since other configurations are the same as those in the fourth embodiment, the description will be omitted here.

Figure 13:
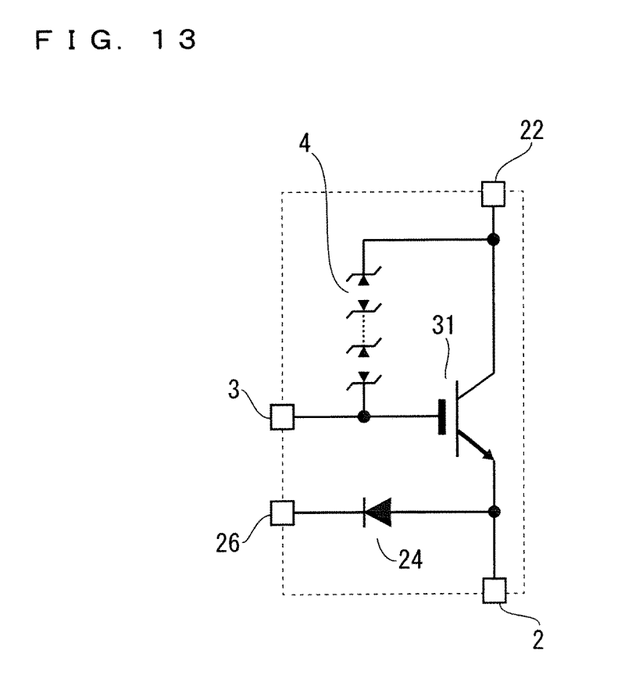
FIG. 13 is a diagram illustrating an equivalent circuit of FIG. 12.

As illustrated in FIGS. 12, 13, the anode of the temperature detection diode 24 is connected to the emitter pad 2. That is, the anode of the temperature detection diode 24 and the emitter electrode of the transistor 31 share the emitter pad 2 with each other. In this manner, since the anode electrode 25 disposed in the fourth embodiment (refer to FIG. 11) can be omitted, the semiconductor device 27 can be downsized, and cost reduction can be achieved.

As for a temperature detection method, in general, a temperature of the semiconductor device 27 is measured by causing a constant current to flow from the anode toward the cathode of the temperature detection diode 24, and monitoring a voltage generated between the anode and the cathode.

Here, the diode is used in a single stage in the example in FIG. 13, but a plurality of diodes may be used in multiple stages, which is connected in series.

As described above, according to the present fifth embodiment, by applying a voltage between the emitter pad 2 and the cathode electrode 26 of the temperature detection diode 24, and monitoring a current flowing by using the temperature detection circuit of the control circuit 29, it becomes possible to detect an overheat state of the semiconductor device 27.

Sixth Embodiment

Figure 14:
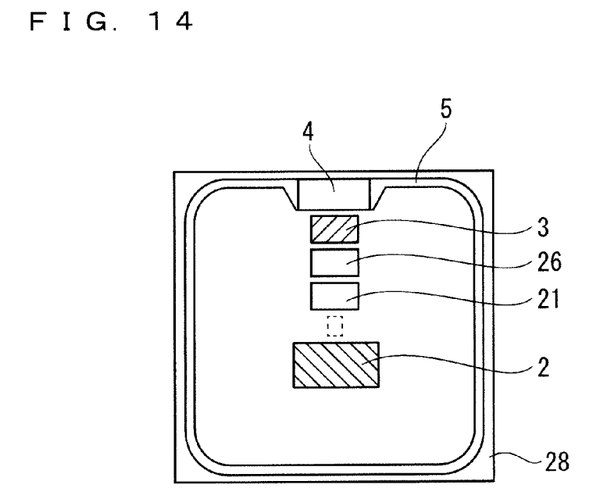
FIG. 14 is a view illustrating an example of a configuration of a semiconductor device according to a sixth embodiment of the present invention.
Figure 15:
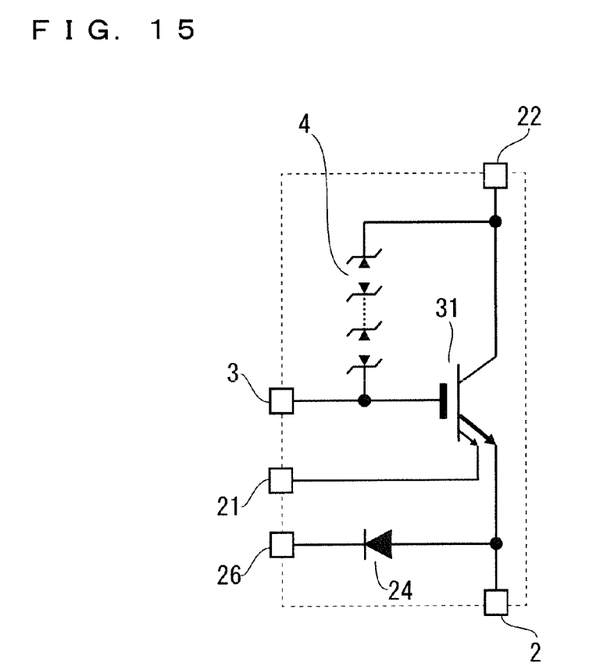
FIG. 15 is a diagram illustrating an equivalent circuit of FIG. 14.

FIG. 14 is a view illustrating an example of a configuration of a semiconductor device 28 according to a sixth embodiment of the present invention, and is an external view of the semiconductor device 28 viewed from above. Further, FIG. 15 is a diagram illustrating an equivalent circuit of FIG. 14.

The present sixth embodiment is characterized in that the semiconductor device 28 includes the current detection transistor and the temperature detection diode. That is, the present sixth embodiment is characterized by combining the third embodiment (FIGS. 8, 9) with the fifth embodiment (FIGS. 12, 13). Since configurations are the same as those in the third embodiment and the fifth embodiment, the description will be omitted here.

As described above, according to the present sixth embodiment, detection of the load current and the temperature in the semiconductor device 28 becomes possible, and can be used for protection against overcurrent and protection against overheat. Accordingly, it is possible to avoid inconvenience caused by a transistor in an abnormal operation and to provide a semiconductor device with higher reliability.

Seventh Embodiment

A seventh embodiment of the present invention is characterized in that the semiconductor substrate 9 in the first to sixth embodiments includes a silicon carbide substrate, instead of the silicon substrate. Since configurations are the same as those in the first to sixth embodiments, the description will be omitted here.

As described above, according to the present seventh embodiment, since the semiconductor device using the silicon carbide substrate becomes possible to operate at higher temperature than the semiconductor device using the silicon substrate according to the first to sixth embodiments, it becomes possible to further downsize a size of the semiconductor device and a heat radiation mechanism. Accordingly, it is possible to contribute to reduction of size and weight of a product using the semiconductor device.

It is noted that, in the present invention, the embodiments can be modified or omitted as appropriate, within the scope of the present invention.

Although the present invention is described in detail, the above described descriptions are illustrative in all aspects, and the present invention is not limited thereto. It is understood that numerous other modifications and variations which are not exemplified can be conceived without departing from the scope of the present invention.

REFERENCE SIGNS LIST

1: semiconductor device
2: emitter pad
3: gate pad
4: clumping diode
5: surface electric field relaxation region
6: region
7: region
8: region
9: semiconductor substrate
10: gate
11: impurity region
12: metal layer
13: field oxide film
14: interlayer film
15: conductive wire
16: semiconductor device
17: semiconductor device
18: semiconductor device
19: semiconductor device
20: semiconductor device
21: current detection emitter pad
22: collector electrode
23: semiconductor device
24: temperature detection diode
25: anode electrode
26: cathode electrode
27: semiconductor device
28: semiconductor device
29: control circuit
30: control terminal
31: transistor
32: transformer
33: ignition plug
34: clamping diode
35: current detection resistor
36: semiconductor device
37: transistor cell region

The invention claimed is:

1. A semiconductor device including a transistor cell region where a plurality of transistor cells is arranged on a semiconductor substrate,
   said semiconductor device comprising an emitter pad which is arranged avoiding said transistor cell region on said semiconductor substrate and is electrically connected to a one-side current electrode of each of said cells, wherein
   said transistor cell region contains a plurality of regions, each of which has a different current drive capability from each other depending on a distance from said emitter pad.

2. The semiconductor device according to claim 1, wherein
   said emitter pad has a circular shape, an elliptical shape, or a polygonal shape having at least five or more vertices.

3. The semiconductor device according to claim 1, wherein
   at least part of said cells includes, in addition to said one-side current electrode, a current detection electrode having a smaller area than that of said one-side current electrode.

4. The semiconductor device according to claim 1, further comprising a temperature detection diode which detects a temperature of said semiconductor device.

5. The semiconductor device according to claim 4, wherein
   an anode of said temperature detection diode is connected to said emitter pad.

6. The semiconductor device according to claim 3, further comprising a temperature detection diode which detects a temperature of said semiconductor device.

7. The semiconductor device according to claim 1, wherein said semiconductor substrate includes a silicon carbide substrate.

8. A semiconductor device including a transistor cell region where a plurality of transistor cells is arranged on a semiconductor substrate, said semiconductor device comprising:
   an electrode pad which is arranged avoiding said transistor cell region on said semiconductor substrate and is electrically connected to a one-side current electrode of each of said cells; and
   a gate pad directly connected to each of the plurality of transistor cells, wherein
   said transistor cell region contains a plurality of regions, each of which has a different current drive capability from each other depending on a distance from said electrode pad.

9. The semiconductor device according to claim 8, wherein
   said electrode pad has a circular shape, an elliptical shape, or a polygonal shape having at least five or more vertices.

10. The semiconductor device according to claim 8, wherein
   at least part of said cells includes, in addition to said one-side current electrode, a current detection electrode having a smaller area than that of said one-side current electrode.

11. The semiconductor device according to claim 8, further comprising a temperature detection diode which detects a temperature of said semiconductor device.

12. The semiconductor device according to claim 11, wherein
   an anode of said temperature detection diode is connected to said electrode pad.

13. The semiconductor device according to claim 10, further comprising a temperature detection diode which detects a temperature of said semiconductor device.

14. The semiconductor device according to claim 8, wherein said semiconductor substrate includes a silicon carbide substrate.

15. A semiconductor device including a transistor cell region where a plurality of transistor cells is arranged on a semiconductor substrate, said semiconductor device comprising:

an electrode pad which is arranged avoiding said transistor cell region on said semiconductor substrate and is electrically connected to a one-side current electrode of each of said cells; and a temperature detection diode which detects a temperature of said semiconductor device, wherein said transistor cell region contains a plurality of regions, each of which has a different current drive capability from each other depending on a distance from said electrode pad, and an anode of said temperature detection diode is connected to said electrode pad.

* * * * *